(12) United States Patent
Azadet et al.

(10) Patent No.: US 12,182,047 B2
(45) Date of Patent: Dec. 31, 2024

(54) CHIP-TO-CHIP INTERFACE OF A MULTI-CHIP MODULE (MCM)

(71) Applicant: Intel Corporation, Santa Clara, CA (US)

(72) Inventors: Kameran Azadet, San Ramon, CA (US); Wee Liew, San Jose, CA (US); Ramani Tatikola, Emmaus, PA (US); Edwin Thaller, Carinthia (AT); Patrick Torta, Villach (AT); Yu-Shan Wang, Hillsboro, OR (US); Georg Weber, Villach (AT); James Yoder, Allentown, PA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/996,594

(22) PCT Filed: Dec. 26, 2020

(86) PCT No.: PCT/US2020/067071
§ 371 (c)(1),
(2) Date: Oct. 19, 2022

(87) PCT Pub. No.: WO2021/247083
PCT Pub. Date: Dec. 9, 2021

(65) Prior Publication Data
US 2023/0236999 A1    Jul. 27, 2023

Related U.S. Application Data

(60) Provisional application No. 63/032,991, filed on Jun. 1, 2020.

(51) Int. Cl.
*G06F 13/36* (2006.01)

(52) U.S. Cl.
CPC .......... *G06F 13/36* (2013.01); *G06F 2213/40* (2013.01)

(58) Field of Classification Search
None
See application file for complete search history.

(56) References Cited

U.S. PATENT DOCUMENTS

| 6,243,797 | B1 * | 6/2001 | Merritt | G11C 7/22 |
| | | | | 711/100 |
| 6,587,907 | B1 * | 7/2003 | Ashby | H05K 1/14 |
| | | | | 713/401 |

(Continued)

OTHER PUBLICATIONS

Apr. 1, 2021 (PCT) International Search Report—App PCT/US2020/067071.

(Continued)

*Primary Examiner* — Farley Abad
*Assistant Examiner* — Dayton Lewis-Taylor
(74) *Attorney, Agent, or Firm* — Banner & Witcoff Ltd.

(57) ABSTRACT

A chip-to-chip interface of a multi-chip module (MCM), including: bidirectional data links for transmitting data signals and a direction indicator bit, wherein the direction indicator bit switches a direction of the bidirectional data links in real-time; a clock link for transmitting a clock signal common to the bidirectional data links, wherein the data and clock links are comprised of conductive traces between the chips and laid out to be of substantially equal length; and a clock driver means having a digitally programmable clock signal delay.

28 Claims, 9 Drawing Sheets

(56) References Cited

U.S. PATENT DOCUMENTS

| | | | |
|---|---|---|---|
| 8,432,768 B2* | 4/2013 | Ware | G06F 3/0673 |
| | | | 365/189.011 |
| 8,972,828 B1* | 3/2015 | Margalit | H03M 13/333 |
| | | | 714/776 |
| 9,099,999 B1* | 8/2015 | Wang | H03K 17/00 |
| 9,767,889 B1* | 9/2017 | Powers | G11C 11/4093 |
| 10,163,763 B1* | 12/2018 | Rasbornig | H01L 23/49575 |
| 10,552,353 B1 | 2/2020 | Farjadrad | |
| 2003/0058479 A1* | 3/2003 | Takaki | H04L 7/0037 |
| | | | 358/409 |
| 2005/0075080 A1 | 4/2005 | Zhang | |
| 2005/0232367 A1* | 10/2005 | North | H04B 3/56 |
| | | | 375/257 |
| 2008/0005518 A1* | 1/2008 | Gillingham | G11C 29/50012 |
| | | | 711/167 |
| 2008/0028474 A1* | 1/2008 | Horne | H04L 9/3247 |
| | | | 726/27 |
| 2009/0327570 A1 | 12/2009 | Takehara | |
| 2013/0076425 A1* | 3/2013 | Oh | G11C 29/022 |
| | | | 327/263 |
| 2013/0195210 A1 | 8/2013 | Swarbrick et al. | |
| 2014/0093022 A1* | 4/2014 | Shi | H04L 41/0866 |
| | | | 375/358 |
| 2015/0318030 A1 | 11/2015 | Wilson et al. | |
| 2017/0110407 A1* | 4/2017 | Chaware | H01L 23/5384 |
| 2019/0042505 A1* | 2/2019 | Subbareddy | H01L 25/0652 |
| 2020/0080383 A1 | 3/2020 | Linde et al. | |
| 2020/0106597 A1* | 4/2020 | Hailu | H04L 7/0337 |

OTHER PUBLICATIONS

ULPI Org: "UTMI+ Low Pin Interface (ULPI) Specification Revision 1.1", Internet Citation, Oct. 20, 2004 (Oct. 20, 2004), pp. I-20, XP002495383, Retrieved from the Internet: URL:http://www.ulpi.org/ULPI_v1_1.zip [retrieved on Sep. 10, 2008].

May 21, 2024 (EP) Search Report—App. 20938604.4.

* cited by examiner

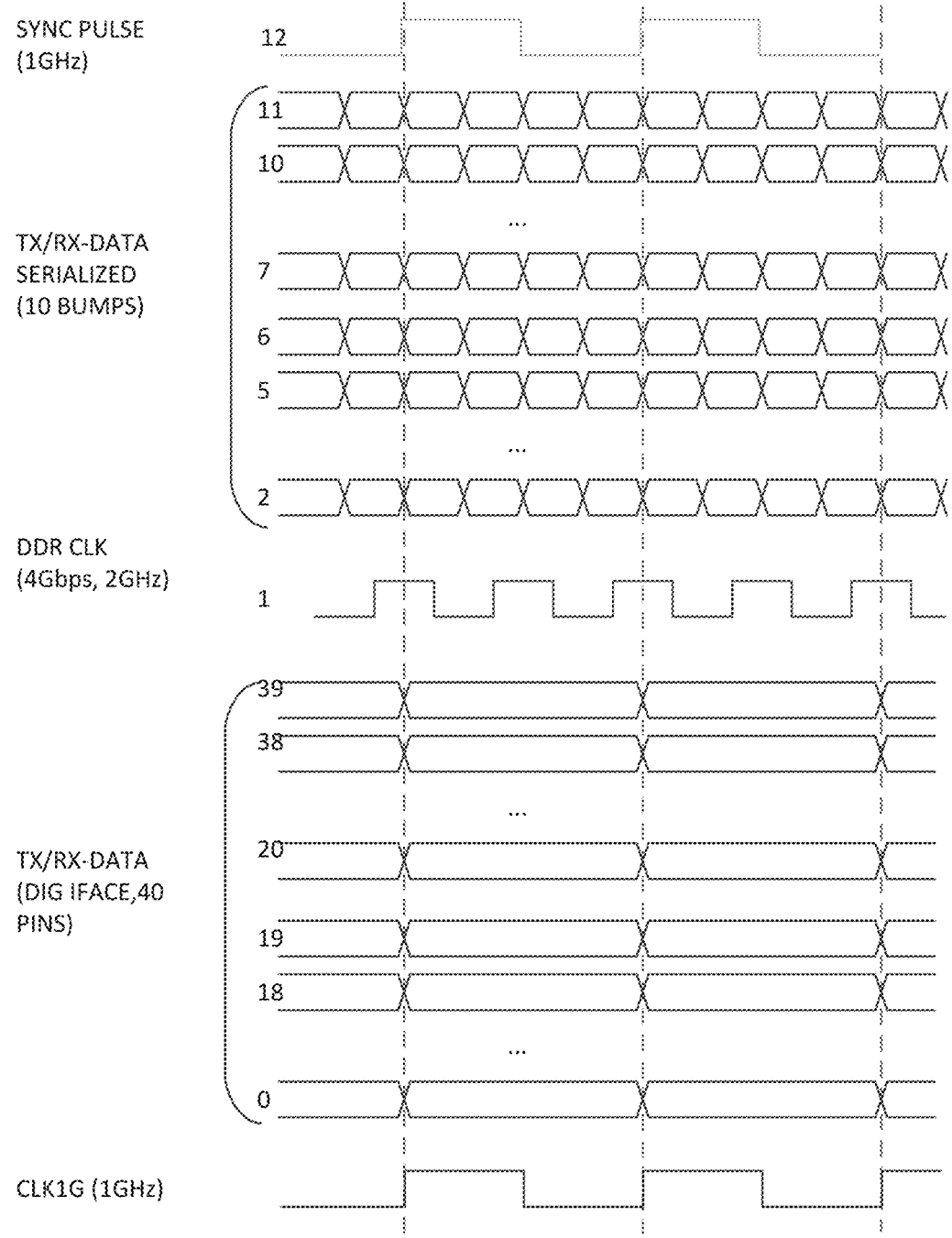

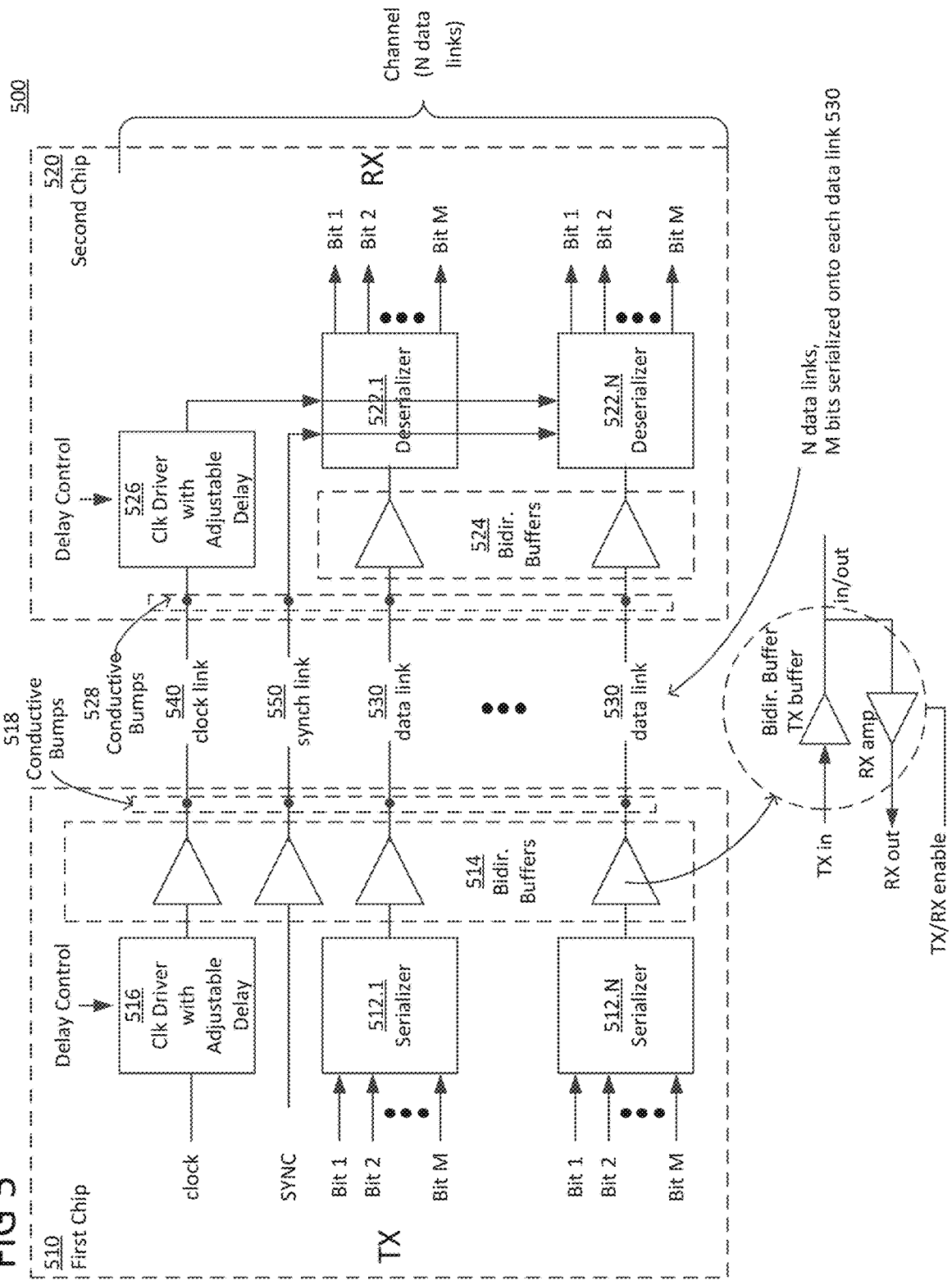

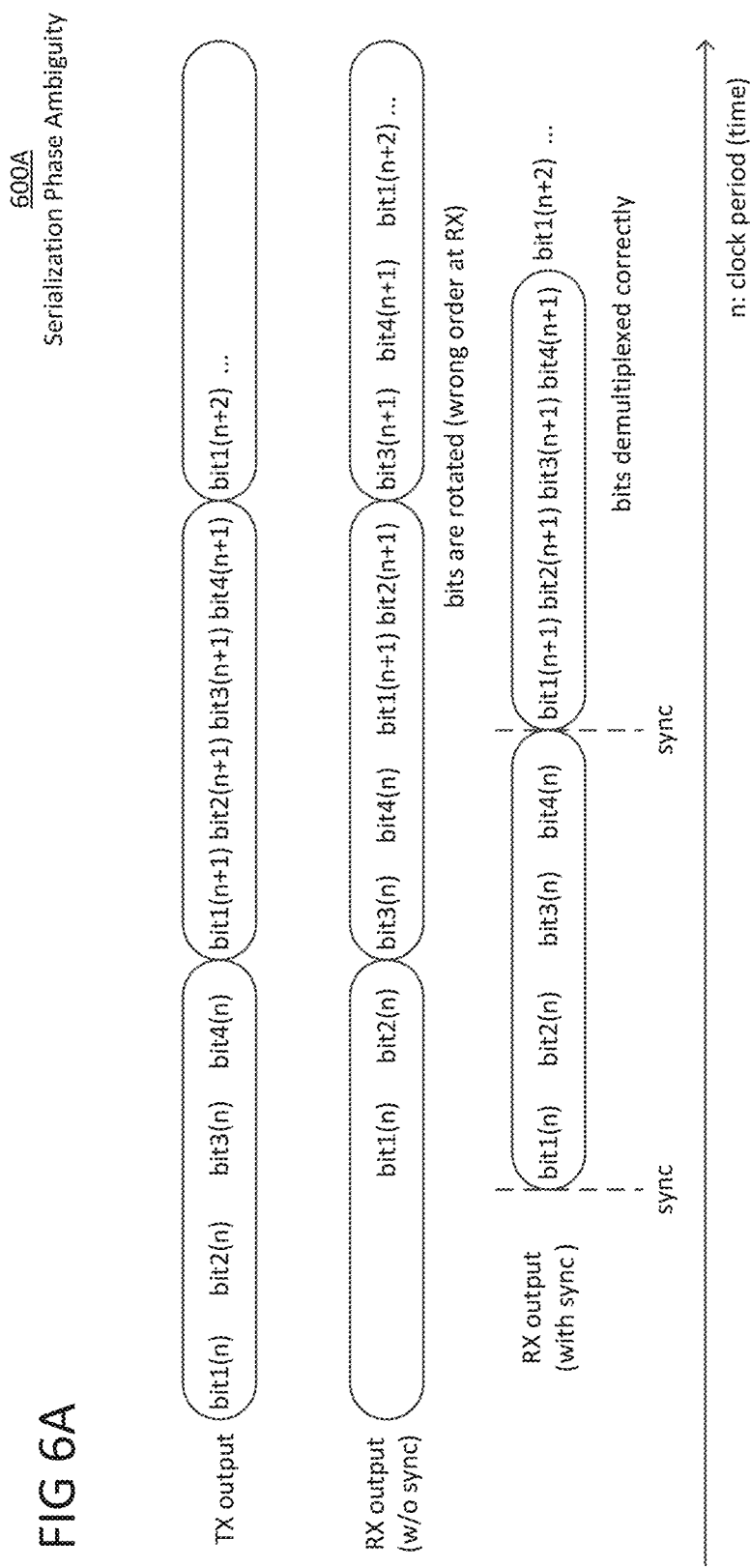

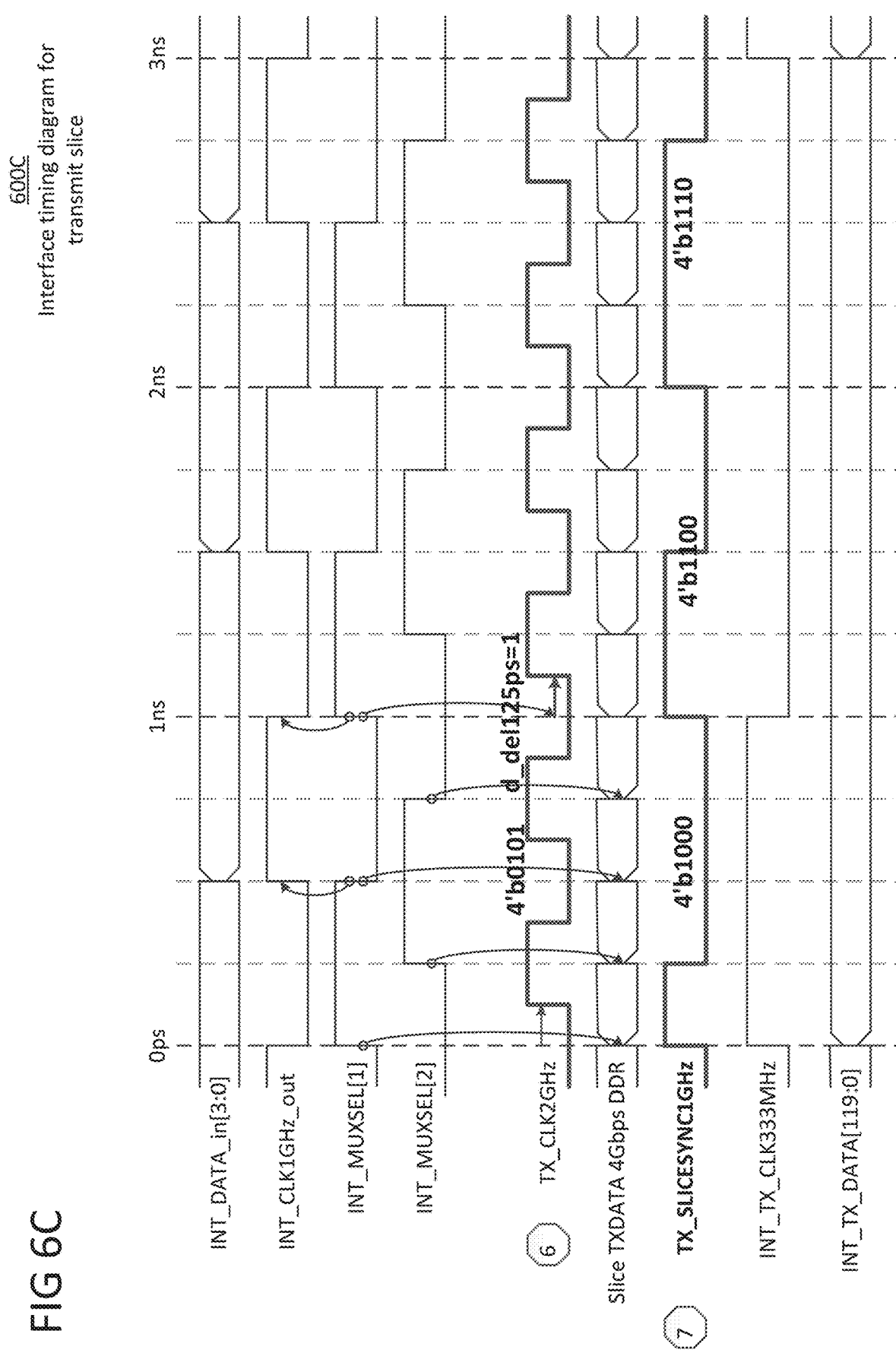

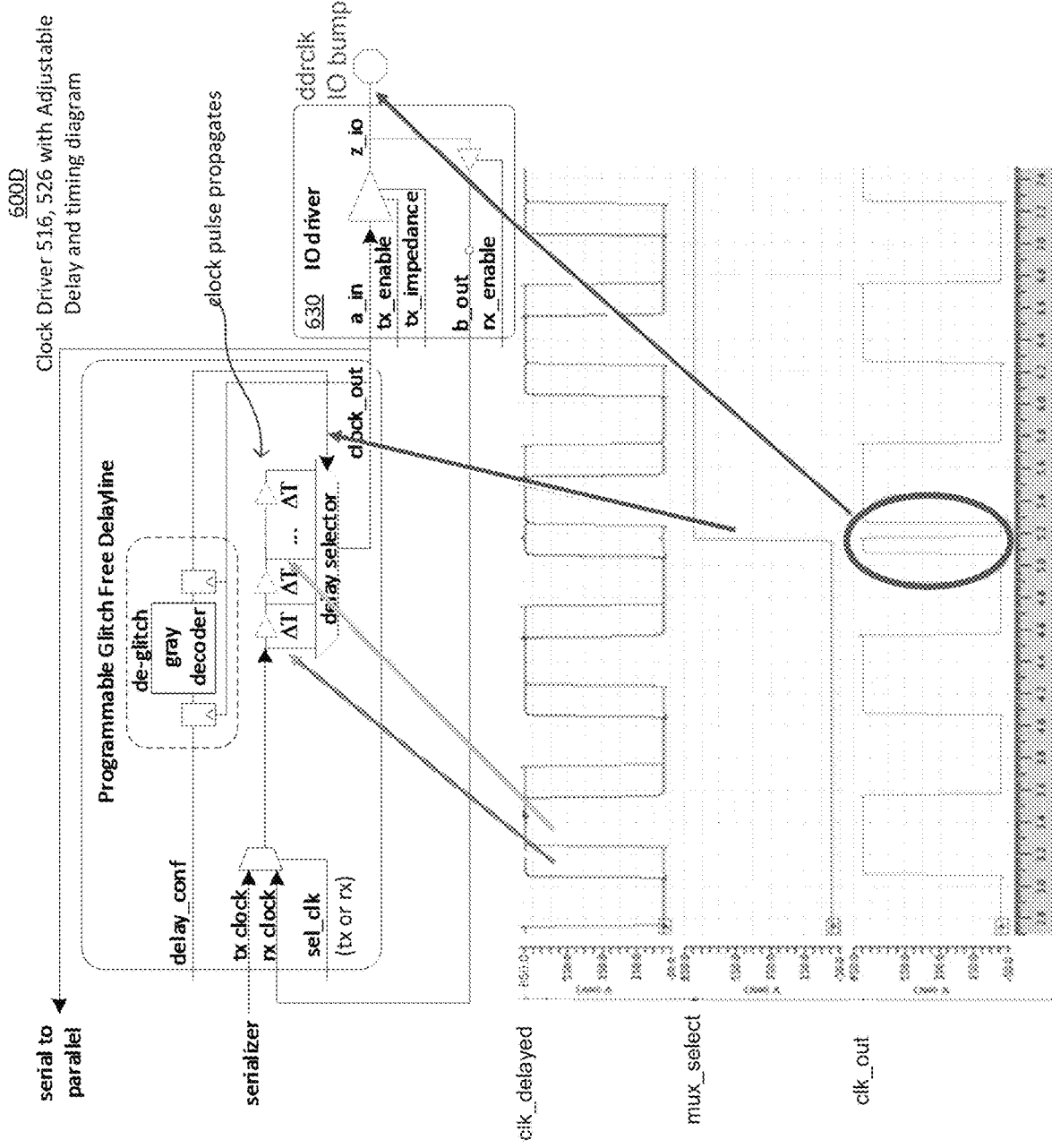

700A
conductive traces of unequal lenth → timing issues 700B
conductive traces of equal length 800
Dedicated supply for driver interleaved with core supply

CHIP-TO-CHIP INTERFACE OF A MULTI-CHIP MODULE (MCM)

TECHNICAL FIELD

Aspects described herein generally relate to chip-to-chip interfaces.

BACKGROUND

Multi-chip non-monolithic integration has been a typical approach to improve System-on-Chip (SoC) yields. Interposer or silicon bridges reduce input/output area and power by employing a bridge die between two chips connected to each other in a same package. Although they offer a significant increase in bump density by employing micro-bumps, interposer/silicon bridge technologies add significant cost. This cost is typically negligible for high end products such as server central processing units (CPUs) or field-programmable gate arrays (FPGAs), but for lower-cost products the additional cost is significant enough to render the solution uncompetitive. Technologies exist for interconnection of chips on organic substrates. These solutions usually target a longer distance within a package (e.g., ~7 mm). The resulting complexity and power consumption is unnecessary for applications in which the two chips are in close proximity to one another (e.g., a few 100 um). Current multi-chip non-monolithic integration techniques are inadequate.

Thus there is a need for a lower power (<=0.5 pJ/bit), lower cost input/output technology to interconnect multiple chips directly on a package substrate without a bridge die or an interposer. Moreover, it is desired to eliminate a complex physical layer requiring a large team of custom analog designers and layout engineers to enable porting to different technologies and different chip orientations (N/S/E/W).

BRIEF DESCRIPTION OF THE DRAWINGS

The accompanying drawings, which are incorporated herein and form a part of the specification, illustrate the aspects of the present disclosure and, together with the description, further serve to explain the principles of the aspects and to enable a person skilled in the pertinent art to make and use the aspects.

FIG. 3 illustrates an example timing diagram of interconnect data and of a serializer/deserializer interface in accordance with aspects of the disclosure.

FIG. 5 illustrates an example transmit and receive chain in accordance with aspects of the disclosure.

FIG. 6A illustrates an example timing diagram of serialization phase ambiguity.

FIG. 6C illustrates an example timing diagram for a transmit slice in accordance with aspects of the disclosure.

FIG. 6D illustrates a clock driver with programmable delay and corresponding timing diagram.

DESCRIPTION OF THE ASPECTS

Figure 1B:
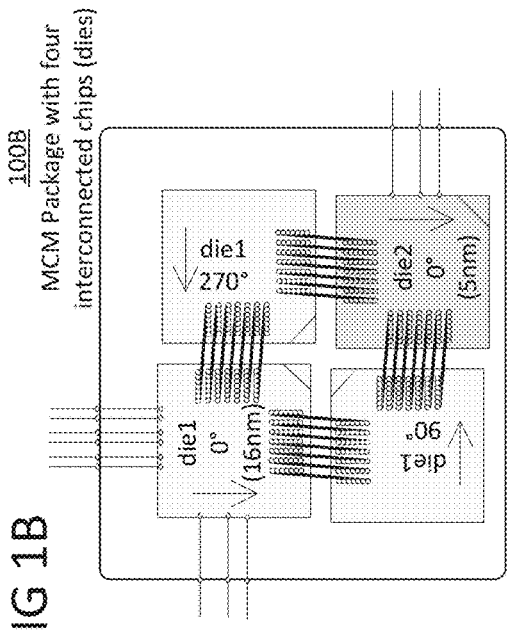
FIGS. 1A and 1B illustrate examples of multi-chip module (MCM) packages including interconnected chips in accordance with aspects of the disclosure.
Figure 1A:
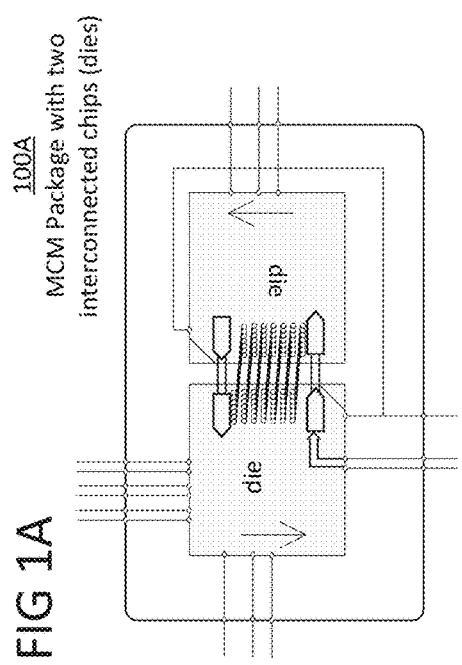

FIGS. 1A and 1B illustrate examples of multi-chip module (MCM) packages 100 including interconnected chips in accordance with aspects of the disclosure.

The aspects described herein enable rotatable designs such that, when chips are rotated, they are still easily interconnected. To achieve these solutions, the aspects described herein describe a direct chip-to-chip interconnect on an organic package substrate in which the chips may implement standard bumps. The aspects include running parallel traces along with a half-rate clock and a sync pulse (to avoid phase ambiguity of the digital word) for a group of data conductive traces. The distance is also maintained to be relatively short (e.g., less than a predetermined ratio of the wavelength of the clock frequency), and need not use terminations.

To reduce silicon cost (bump area) in wireless applications, a bidirectional buffer and out of band signaling to indicate link direction can take advantage of time-division duplex/frequency division duplex (TDD/FDD) applications to reduce the number of bumps by a factor of two. This is possible because in FDD mode both transmit (TX) and receive (RX) are active and usually have the same bandwidth. However, since FDD bands are below 3 GHz, a half sampling rate is possible. In TDD bands (e.g., up to 6 GHz), a full sampling rate is needed, but the link is only in the TX or RX direction.

FIG. 1A illustrates a package 100A including two interconnected chips. FIG. 1B illustrates an example package 100B including four interconnected chips oriented at 0°, 90°, 270°, and 0°. This technology disclosed herein will sometimes be referred to as Direct Die-to-Die Interconnect, D3I, direct chip-to-chip interconnect, chip-to-chip interconnect, or simply interconnect.

Figure 2:
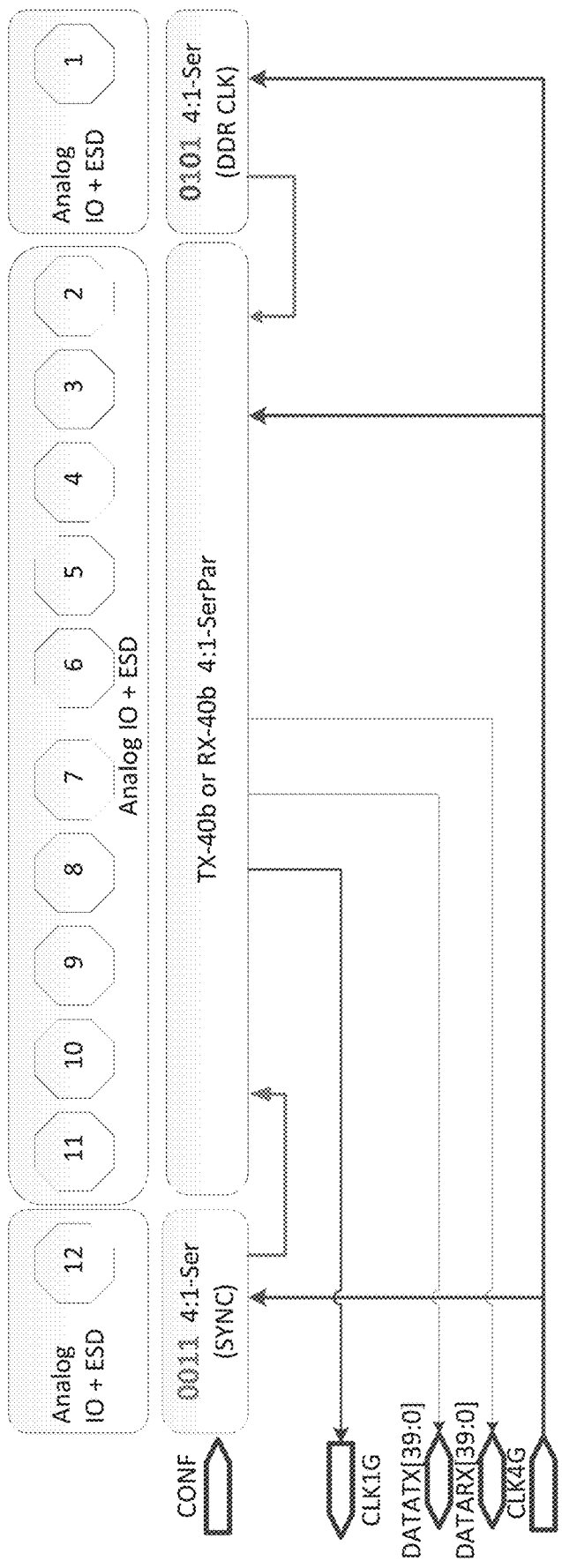
FIG. 2 illustrates an example individual scalable block of an overall chip-to-chip interface in accordance with aspects of the disclosure.

The layout as described herein maintains a conductive trace length match by providing connections between bumps in a row on one chip to corresponding similarly-positioned bumps in a row below on the next chip. For example, FIG. 1A illustrates example MCM package 100A including four interconnected chips, and FIG. 2 illustrates an example individual scalable block 200 of an overall interface, in accordance with aspects of the disclosure. As an illustrative example, the MCM package 100A as shown in FIG. 1A includes a left-side chip and a right-side chip in the orientation shown. Each of these chips includes a series of bumps for interconnecting with the other chip. In the example shown in FIG. 1A, the bumps are arranged in a series of linear one-dimensional rows, with each row having six bumps each. The rows in the right-side chip, however, are offset (shifted) one row down from those in the left-side chip. In other words, the topmost row on the second chip aligns with the second to the topmost row on the first chip. The leftmost bump of the top row of bumps in the left side chip is connected to a corresponding similarly-positioned leftmost bump in the top row of the bumps in the right side chip.

Figure 4:
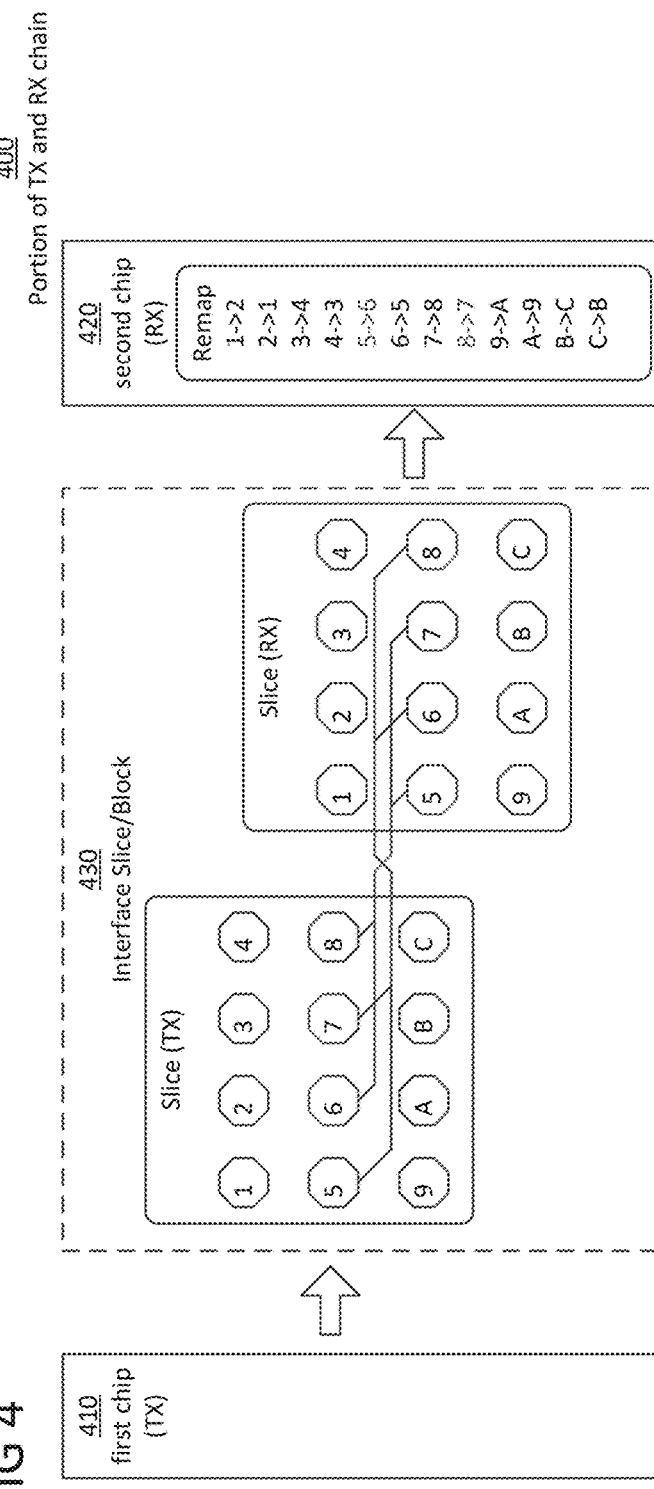
FIG. 4 illustrates an example portion of a transmit and receive chain in accordance with aspects of the disclosure.

This connection scheme is repeated for each of the bumps on each chip as shown in FIG. 1A to connect each of the bumps on each chip to one another. Although the bumps shown in this example are one-dimensional with six bumps on each row of each chip, this is by way of example and not limitation. In fact, each chip may have any suitable number of bumps grouped into any suitable arrangement. As an illustrative example, each chip may have any number of 12 bumps (referred to as a 12-pack), an example of which is shown in FIG. 4 (slice (TX) and slice (RX)). Regardless of the number of bumps and the groupings of bumps on each chip, aspects include disposing the bumps such that a one-row offset is provided in one dimension of one chip with respect to the other chip, as shown in FIG. 4. Due to this orientation, the aspects described herein advantageously may connect the correspondingly numbered bumps to one another (e.g., 1-1, 2-2, and so on) using trace routes that have identical or nearly identical (e.g., within 1% of one another or less due to fabrication tolerances). Without this offset, the trace lengths interconnecting the chips to one another cannot easily be made the same length without crossing traces over one another, which presents particular difficulty when only a small number (e.g., two) layers are available in the substrate of interest.

The orientation and coupling between chips using bumps and connections oriented as noted above ensures that the trace routes interconnecting each bump within the set of bumps (e.g., a 12-pack) are the same, which allows for the use of simplified logic and enables a mostly synthesizable interface. The aspects described herein also facilitate custom placement of retiming and buffer+ESD circuits. The sensitive lines can be shielded and, as the interconnect circuits are very compact, the rest of the available area under the bump array can be used for a different functionality (e.g., gates or SRAMs). As a result, the interface eases the need for design for testing (DFT) and implements a self-test linear feedback shift register (LFSR) circuitry.

FIG. 2 illustrates an example individual scalable block 200 of an overall interface, and FIG. 3 illustrates a timing diagram of the interface, in accordance with aspects of the disclosure. The slice or block 200 is used in accordance with an interface at each of the chips of the MCM packages 100 as shown in FIGS. 1A and 1B as examples. The block or slice 200 implements 12 bumps, using 10 data bits in this example. The block 200 is scalable, and thus each chip interface may be built by scaling these blocks to transfer data, in this example, over 12 bumps, but may be scaled for each of the bumps on each chip and for any suitable bump groupings. In an aspect, the block 200 may be instantiated multiple times to cover the application needs. For instance, the block 200 functions to transmit, over the 12 bumps as shown in FIG. 2, a delayed DDR clock, 10 DDR data lines, and a synchronization pulse to synchronize the TX serializer and the TX deserializer (i.e., parallelizer). Any suitable number and/or type of serializer and deserializer may be used in accordance with aspects of the present disclosure. To provide an example, a 4:1 serializer and a 1:4 deserializer may be implemented, although this is by way of example and not limitation.

FIG. 4 illustrates a TX and RX chain 400 in accordance with aspects of the disclosure. The example TX and RX chain 400 is associated with a single slice or block 430, and thus represents a block or slice TX and RX circuit. The slice TX and RX circuit 400 is an example of a slice TX and RX chain that may be implemented by the block 200 as shown in FIG. 2. Thus, the overall interface may include any suitable number of the blocks 200 as shown in FIG. 2, each connecting any suitable number of bumps between chips 410, 420 (e.g., 12 bumps as shown in FIG. 2) and operating in accordance with a corresponding slice TX and RX circuit 400 as shown in FIG. 4. In an aspect, each of the slice TX and RX circuits 400 may be statically programmed as TX or RX to reverse the information direction and to increase flexibility with respect to a physical layout. The remapping is an example and not limiting. The remapping is dependent on the actual arrangement of the TX bumps and to avoid crossings in the substrate.

FIG. 5 illustrates an example TX and RX chain 500 in accordance with aspects of the disclosure.

A first chip 510 and a second chip 520 are provided in a same package. Each conductive bump 518, 528 is capable of transmitting or receiving in accordance with the configurations of the bidirectional buffers 514, 524. An example bidirectional buffer 514, 524 is shown in the dotted circle; bidirectional buffers are known, and of the sake of brevity, a detailed description is omitted.

Bidirectional data links 530 between the chips 510, 520 are configured to transmit data signals and a direction indicator bit, wherein the direction indicator bit switches a direction of the bidirectional data links 530 in real-time. The direction indicator bit may be encoded in a redundant bit of the data signals. Optionally, at least one of the data links 530 may be dedicated to transmit the direction indicator bit. Also, the data signal may comprise at least one redundant bit for error correction.

A single channel is shown and defined as N bidirectional data links 530, with each data link 530 carrying M bits per clock cycle. By way of example, there may be N=10 bidirectional data links 530, each carrying M=4 bits, so a total of 40 bits per channel per clock cycle. Optionally, the interface between the chips 510, 520 may comprise a plurality of channels. Each channel can flip direction independently (e.g., for observation receiver during transmission, or calibration mode) based on the direction indicator bit. Use of the indicator bits per channel allows flexible TX/RX partitioning.

A clock link 540 is configured to transmit a clock signal common to the bidirectional data links 530. The data links 530 and clock link 540 are comprised of conductive traces between the first and second chips 510, 520 and laid out to be of substantially equal length.

The data and clock links 530, 540 may be provided on a package substrate directly. Alternatively, the data and clock links 530, 540 may be provided on an interposer or bridge die, though this is by way of example and not by limitation. And the data and clock links 530, 540 may be unterminated.

A clock driver circuit 516/526 has a digitally programmable clock signal delay circuit to reduce and/or adjust skew. The clock signal delay circuit is programmable to target a delay presenting an eye open enough for a clean reception. Optionally, the clock signal delay circuit may be programmed during operation and based on a measured temperature or voltage, or a measured delay in a reference circuit. There can be measurement circuits (including sensors) inside each of the chips 510, 520 to measure temperature, monitor process, voltage, etc. There could be even multiple such circuits spread out through the chips 510, 520 at convenient locations or areas of concern. Alternatively, the clock signal delay may be programmed before data signal transmission.

The clock and data signals are de-skewed because when the data signal toggles (depending on the actual data being sent), coupling and reflections cause ripples. The clock signal is preferably transmitted over the clock link when the other links are settled and quiet so that the clock signal is clean.

The conductive bumps 518, 528 connect the data, clock, and synch links 530, 540, 550 between the chips 510, 520, and preferably are provided on each of the chips 510, 520 with a symmetrical mapping layout.

The synchronization link 550 is configured to transmit a synch pulse to synchronize a deserializer 522.1 of one of the chips (in this case the second chip 520) with a serializer 512 of the other chip (in this case the first chip 510). Without the synch pulse, the deserialization may result in serialization phase ambiguity.

FIG. 6A illustrates an example timing diagram 600A of serialization phase ambiguity.

The serializer 512 at the TX serializes (multiplexes) M bits (digital data word) to be transmitted over each of the N data links 530 from the first chip 510 to the second chip 520, as shown in the first row of the figure. Subsequently, the deserializer 522 at the RX deserializer (demultiplexer) these M bits, as shown in the second row of the figure. In this example, at time n four of the bits are serialized, and then at time n+1, the next four of the bits are serialized. The data sent on the data link 530 is the first four bits (bit 1 of n, bit 2 of n, bit 3 of n, bit 4 of n), and then the next four bits (bit 1 of n+1, bit 2 of n+1 . . . ) in a serial manner.

The synch pulse 550 delineates, with a rising edge for example, where the four bits (digital data word) begin. Without the synch pulse 550, a delay in the clock 540 might result in the deserializer 522 at the RX dividing a word of four bits into separate words resulting in error, as shown in the second row of the figure. The synch pulse 550, however, indicates the first bit of the data word, resulting in correct deserialization as shown in the third row.

Figure 6B:
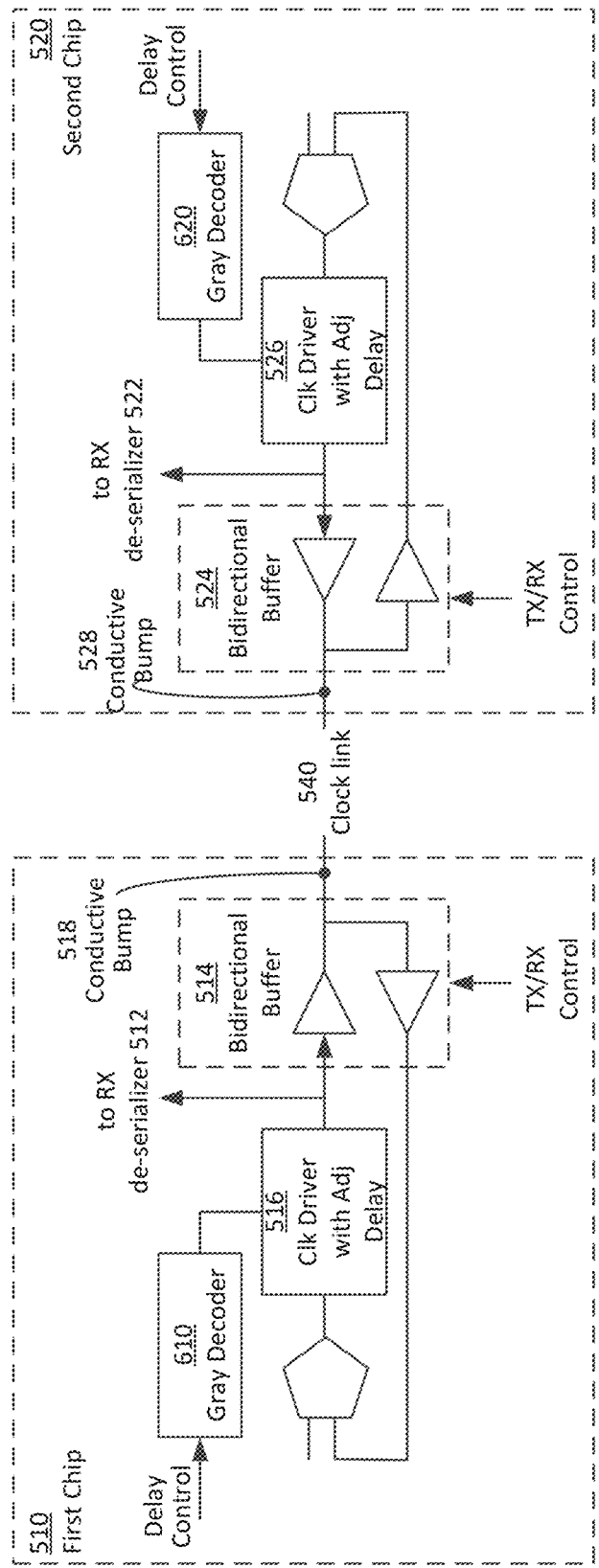
FIG. 6B illustrates a portion of an example TX and RX chain in accordance with aspects of the disclosure.

FIG. 6B illustrates a portion of an example TX and RX chain 600B related to the clock link of FIG. 5.

Specifically, the clock driver circuit 516/526 has a digitally programmable clock signal delay to adjust a timing of the clock signal. A Gray decoder 610/620 sets the adjustable delay on the clock signal based on a delay control signal. Each buffer 514, 524 introduces a delay. In an aspect, the TX clock may be delayed to be in the middle of the "eye" with respect to an eye diagram. In other words, the TX clock delay may be used as a calibration parameter to enable reliable detection of appropriate logic values. The process-voltage-temperature (PVT) variation of the delay may be measured and adapted using information of the modulated synch pulse. The clock signal delay is Gray-encoded to adjust one step at a time as PVT variations are relatively slow. Thus the programmable clock signal delay corrects for skew on-the-fly.

FIG. 6C illustrates an example interface timing diagram 600C for a transmit slice in accordance with aspects of the disclosure. The rise of the synchronization pulse (third signal from the bottom of the figure) indicates a delineation of the bits, in this example at the rising edge. Optionally, the synchronization pulse length (falling edge) is configurable to carry additional information between the chips. This additional information may be a change in the direction of the links as an alternative or in addition to the indicator bit.

FIG. 6D illustrates a clock driver 516, 526 with programmable delay and corresponding timing diagram 600D.

A change of clock delay should be without glitches. A glitch could result in a double latch of the same data, and then the serializer 512/deserializer 522 would result in errors. As shown, the serializer 512 generates a clock, the clock (rising edge and falling edge) propagates through the delay selector, and is then output from the IO driver 630 as clock_out. This clock output is also used to relatch the delay configuration. When a glitch occurs, as identified in the figure by the circled portion of the clk_out signal, two rising edges in a block transmission are seen instead of one, resulting in a double-latching and corruption of the data. Programming the delay using the Gray decoder 610, which produces only a single bit change at each step, delay glitches are avoided or at least significantly reduced.

Further, separated RX and TX allows for a tristate IO driver 630 at the channel IO (TDD switching) to avoid crossbar currents. If two chips reverse their transmitting and receiving roles, there is a risk during the transition of crossbar currents. Crossbar currents can be avoided if as a middle step during the transition both chips go into a high-impedance state, or alternatively, both chips are pulled down to the common reference voltage. Also, a shared VDDIO (IO driver supply) and VSS between the two chips improves PVT robustness. Level shifters and isolation cells can decouple the chips from the VDDCORE. Also, TX impedance is programmable and can be used also as a weak termination.

Figure 7A:
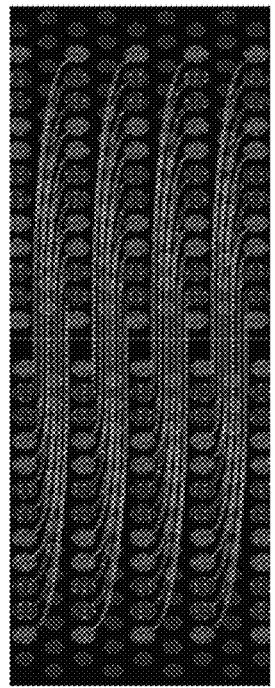
FIG. 7A illustrates an example interconnect circuit layout with conductive traces not having equal lengths.
Figure 7B:
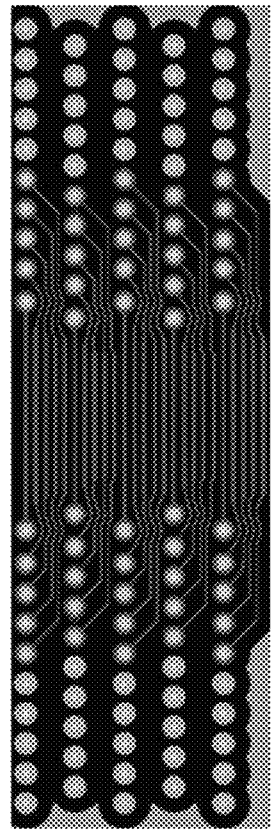
FIG. 7B illustrates an example interconnect circuit layout with conductive traces of equal length in accordance with aspects of the disclosure.

FIG. 7A illustrates an interconnect with conductive traces of unequal lengths (not desired), and FIG. 7B illustrates an interconnect with conductive traces having equal lengths (desired). For the purpose of interconnecting chips to one another, the physical layout of the substrate is important. To avoid the need of a clock recovery circuit, there should be a matched overall propagation delay for each conductive trace. In other words, the length of the interconnect should be the same for each line. FIG. 7A which shows as example of a two-metal substrate interconnect with conductive traces of unequal length, which is likely to expose the design to timing issues. In comparison, the example circuit layout as shown in FIG. 7B shows an interconnect with conductive traces having equal lengths in accordance with aspects of the present disclosure. The connection between the left and right chip shows how several of the 12-bump slices can be connected to maintain the same length as a result of the bump orientation on the chips being offset from one another. As a result, the interface yields a compact circuit. In particular, the area under the standard bumps is available for other circuits.

Figure 8:
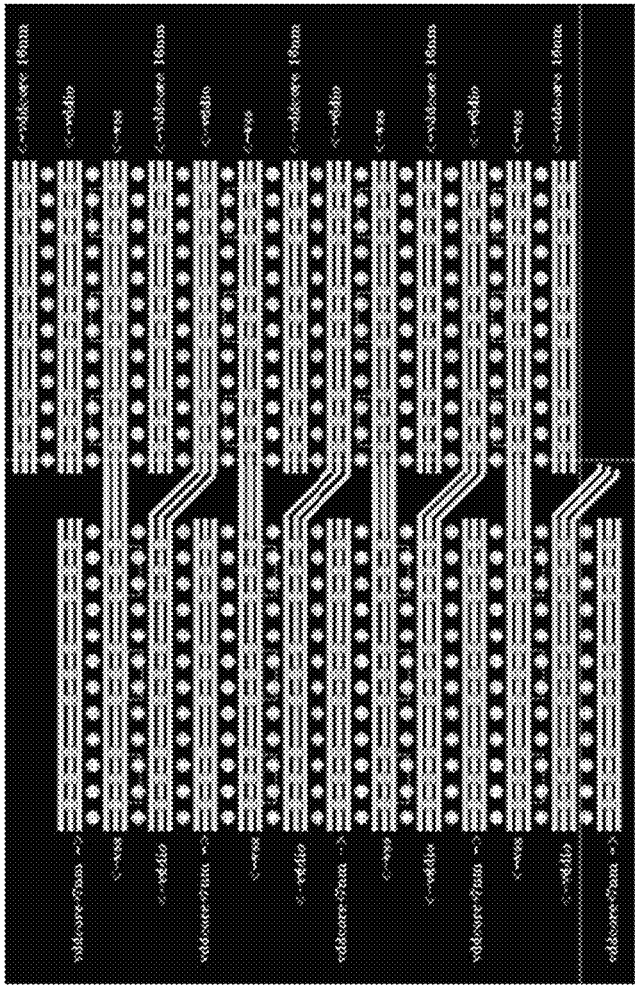
FIG. 8 illustrates an example routing of a power supply between chips in accordance with aspects of the disclosure The exemplary aspects of the present disclosure will be described with reference to the accompanying drawings. The drawing in which an element first appears is typically indicated by the leftmost digit(s) in the corresponding reference number.

FIG. 8 illustrates an example routing 800 of a power supply between chips in accordance with aspects of the disclosure. A common power supply is shared by the chips. Because the driver may require a dedicated supply VDDIO, aspects include interleaving the VDDIO lines with the core supply VDDCORE lines as shown. The VDDCORE lines may be different between the two interconnected chips.

The aspects described herein overcome the disadvantages of prior chip-to-chip solutions by providing a low cost implementation that uses a direct connection on a package substrate (no interposer or silicon bridge), uses regular c4 bumps (controlled collapse chip connection bumps), and frees the area under the bumps for other logic circuits. Furthermore, the aspects described herein use flexible transmission/reception mapping, which provides flexible support for N1 channels in transmit and N2 channels in receive, where N1+N2 is a total number of channels, with the extreme case being that all channels are used in one direction at a given time. Moreover, to reduce the bump area by factor of two, in wireless applications the interface aspects described herein is capable of switching direction in real-time to support optimally TDD/FDD cases with half the number of bumps.

Furthermore, the aspects described herein are capable of operating in a low power environment (e.g. <0.5 pJ/bit), and may achieve a bit error rate of less than $10^{-18}$ without the need for forward error correction (FEC). The aspects described herein also provide solutions to ensure ease of porting, which eliminates the need for a complex physical layer (i.e., the input/output can be designed with standard digital design methodology (RTL, synthesis, place & route, with the exception of input/output buffer and electro-static discharge (ESD)) to minimize design and porting efforts. The aspects described herein may also be advantageously extended to include multiple technologies and support multiple orientations. Still further, the aspects described herein support an open standard and thus allow system vendors to have an ecosystem of silicon partners and mix and match devices, which may be either designed by themselves or by other silicon vendors. The aspects described herein also provide an FPGA friendly design that is electrically compatible with future FPGA products (e.g., the Advanced Interface Bus (AIB)), to enable use of chiplets with D3I in FPGA products.

The techniques of this disclosure may also be described in the following examples.

Example 1. A chip-to-chip interface of a multi-chip module (MCM), comprising: bidirectional data links for transmitting data signals and a direction indicator bit, wherein the direction indicator bit switches a direction of the bidirectional data links in real-time; a clock link for transmitting a clock signal common to the bidirectional data links, wherein the data and clock links are comprised of conductive traces between the chips and laid out to be of substantially equal length; and a clock driver means having a digitally programmable clock signal delay.

Example 2. The chip-to-chip interface of claim 1, wherein the direction indicator bit is encoded in a redundant bit of the data signals.

Example 3. The chip-to-chip interface of claim 1, wherein at least one of the data links is dedicated to transmit the direction indicator bit.

Example 4. The chip-to-chip interface of claim 1, wherein the clock signal delay is programmable to align an edge of the clock signal with a middle of an eye pattern of the data signal.

Example 5. The chip-to-chip interface of claim 1, wherein the clock signal delay is programmed before data signal transmission.

Example 6. The chip-to-chip interface of claim 1, wherein the clock signal delay is programmed during operation and based on a measured temperature or voltage, or a measured delay in a reference circuit.

Example 7. The chip-to-chip interface of claim 1, wherein the clock signal delay is Gray-encoded.

Example 8. The chip-to-chip interface of claim 1, further comprising: a synchronization link for transmitting a synchronization pulse to synchronize a deserializer of one of the chips with a serializer of the other chip.

Example 9. The chip-to-chip interface of claim 8, wherein a length of the synchronization pulse is configurable to carry additional information between the chips.

Example 10. The chip-to-chip interface of any one or more of claims 1-9, further comprising: conductive bumps, which connect the data and clock links between the chips, provided on each of the chips with a symmetrical mapping layout.

Example 11. The chip-to-chip interface of claim 1, wherein the data signal comprises at least one redundant bit for error correction.

Example 12. The chip-to-chip interface of claim 1, wherein the data and clock links are unterminated.

Example 13. The chip-to-chip interface of claim 1, wherein the data and clock links are provided on a package substrate directly.

Example 14. The chip-to-chip interface of claim 1, wherein the data and clock links are provided on an interposer or bridge die.

Example 15. The chip-to-chip interface of claim 1, further comprising: a common power supply shared by the chips.

Example 16. The chip-to-chip interface of claim 1, wherein the bidirectional data links comprise a single channel.

Example 17. The chip-to-chip interface of claim 16, wherein the chip-to-chip interface comprises a plurality of channels.

Example 18. A multi-chip module (MCM), comprising: a first chip; a second chip; and a chip-to-chip interface, comprising: bidirectional data links for transmitting data signals and a direction indicator bit, wherein the direction indicator bit switches a direction of the data signal transmission in real-time; a clock link for transmitting a clock signal common to the bidirectional data links, wherein the data and clock links are comprised of conductive traces between the first and second chips and laid out to be of substantially equal length; and a clock driver means having a digitally programmable clock signal delay.

Example 19. The MCM of claim 18, wherein the direction indicator bit is encoded in a redundant bit of the data signals.

Example 20. The MCM of claim 18, wherein at least one of the data links is dedicated to transmit the direction indicator bit.

Example 21. The MCM of claim 18, wherein the chip-to-chip interface further comprises: a synchronization link for transmitting a synchronization pulse to synchronize a deserializer of one of the chips with a serializer of the other chip.

Example 22. The MCM of any one or more of claims 18-21, further comprising: conductive bumps, which connect the data and clock links between the chips, provided on each of the chips with a symmetrical mapping layout.

Example 23. MCM of claim 18, further comprising: a package substrate on which the data and clock links are provided on directly.

Example 24. The MCM of claim 18, further comprising: an interposer or bridge die on which the data and clock links are provided.

Example 25. The MCM of claim 18, further comprising: a common power supply shared by the chips.

Example 26. A chip-to-chip interface of a multi-chip module (MCM), comprising: groups of bidirectional data links configured to transmit data signals and a direction indicator bit, wherein the direction indicator bit switches a direction of the groups of bidirectional data links in real-time; a clock link configured to transmit a clock signal common to the groups of bidirectional data links, wherein the data and clock links are comprised of conductive traces between the chips and laid out to be of substantially equal length; and a clock driver circuit having a digitally programmable clock signal delay.

Example 27. The chip-to-chip interface of claim 26, wherein the direction indicator bit is encoded in a redundant bit of the data signals.

Example 28. The chip-to-chip interface of claim 26, wherein at least one of the data links is dedicated to transmit the direction indicator bit.

Example 29. The chip-to-chip interface of claim 26, wherein the clock signal delay is programmable to align an edge of the clock signal with a middle of an eye pattern of the data signal.

Example 30. The chip-to-chip interface of claim 26, wherein the clock signal delay is programmed before data signal transmission.

Example 31. The chip-to-chip interface of claim 26, wherein the clock signal delay is programmed during operation and based on a measured temperature or voltage, or a measured delay in a reference circuit.

Example 32. The chip-to-chip interface of claim 26, wherein the clock signal delay is Gray-encoded.

Example 33. The chip-to-chip interface of claim 26, further comprising: a synchronization link configured to transmit a synchronization pulse to synchronize a deserializer of one of the chips with a serializer of the other chip.

Example 34. The chip-to-chip interface of claim 8, wherein a length of the synchronization pulse is configurable to carry additional information between the chips.

Example 35. The chip-to-chip interface of claim 26, further comprising: conductive bumps, which connect the data and clock links between the chips, provided on each of the chips with a symmetrical mapping layout.

Example 36. The chip-to-chip interface of claim 26, wherein the data signal comprises at least one redundant bit for error correction.

Example 37. The chip-to-chip interface of claim 26, where the data and clock links are unterminated.

Example 38. The chip-to-chip interface of claim 26, wherein the data and clock links are provided on a package substrate directly.

Example 39. The chip-to-chip interface of claim 26, wherein the data and clock links are provided on an interposer or bridge die.

Example 40. The chip-to-chip interface of claim 26, further comprising: a common power supply shared by the chips.

Example 41. The chip-to-chip interface of claim 26, wherein the groups of bidirectional data links comprise a single channel.

Example 42. The chip-to-chip interface of claim 16, wherein the chip-to-chip interface comprises a plurality of channels.

Example 43. A multi-chip module (MCM), comprising: a first chip; a second chip; and a chip-to-chip interface, comprising: groups of bidirectional data links configured to transmit data signals and a direction indicator bit, wherein the direction indicator bit switches a direction of the data signal transmission in real-time; a clock link configured to transmit a clock signal common to the groups of bidirectional data links, wherein the data and clock links are comprised of conductive traces between the first and second chips and laid out to be of substantially equal length; and a clock driver circuit having a digitally programmable clock signal delay.

Example 44. The MCM of claim 43, wherein the direction indicator bit is encoded in a redundant bit of the data signals.

Example 45. The MCM of claim 43, wherein at least one of the data links is dedicated to transmit the direction indicator bit.

Example 46. The MCM of claim 43, wherein the chip-to-chip interface further comprises: a synchronization link configured to transmit a synchronization pulse to synchronize a deserializer of one of the chips with a serializer of the other chip.

Example 47. The MCM of claim 43, further comprising: conductive bumps, which connect the data and clock links between the chips, provided on each of the chips with a symmetrical mapping layout.

Example 48. The MCM of claim 43, further comprising: a package substrate on which the data and clock links are provided on directly.

Example 49. The MCM of claim 43, further comprising: an interposer or bridge die on which the data and clock links are provided.

Example 50. The MCM of claim 43, further comprising: a common power supply shared by the chips.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A chip-to-chip interface of a multi-chip module (MCM) that enables a transfer of data signals between chips of the MCM including a first chip and a second chip, comprising:
   bidirectional data links configured to transmit data signals and a direction indicator bit between the first chip and the second chip,
   wherein the direction indicator bit switches a direction of the bidirectional data links in real-time;
   a clock link configured to transmit a clock signal common to the bidirectional data links between the first chip and the second chip,
   wherein the bidirectional data links and the clock link are comprised of conductive traces between the first chip and the second chip and laid out to be of substantially equal length;
   a decoder configured to output a clock delay signal based upon a delay control signal; and
   a clock driver circuit having a digitally programmable clock signal delay that is based upon the clock delay signal, which prevents the clock signal from including multiple rising edges for a single transmission,
   wherein a timing of the clock signal is adjusted in response to the digitally programmable clock signal delay.

2. The chip-to-chip interface of claim 1, wherein the direction indicator bit is encoded in a redundant bit of the data signals.

3. The chip-to-chip interface of claim 1, wherein at least one of the bidirectional data links is dedicated to transmit the direction indicator bit.

4. The chip-to-chip interface of claim 1, wherein the clock signal delay is programmable to align an edge of the clock signal with a middle of an eye pattern of the data signal.

5. The chip-to-chip interface of claim 1, wherein the clock signal delay is programmed before data signal transmission.

6. The chip-to-chip interface of claim 1, wherein the clock signal delay is programmed during operation and based on a measured temperature or voltage, or a measured delay in a reference circuit.

7. The chip-to-chip interface of claim 1, wherein the clock signal delay is Gray-encoded.

8. The chip-to-chip interface of claim 1, further comprising:
a synchronization link configured to transmit a synchronization pulse to synchronize a deserializer of one of the first or second chip with a serializer of the other one of the first or second chip.

9. The chip-to-chip interface of claim 8, wherein a length of the synchronization pulse is configurable to carry additional information between the first and the second chip.

10. The chip-to-chip interface of claim 1, further comprising:
conductive bumps, which connect the bidirectional data links and the clock link between the first and the second chip, provided on each of the first and the second chip with a symmetrical mapping layout.

11. The chip-to-chip interface of claim 1, wherein the data signal comprises at least one redundant bit for error correction.

12. The chip-to-chip interface of claim 1, wherein the bidirectional data links and the clock link are unterminated.

13. The chip-to-chip interface of claim 1, wherein the bidirectional data links and the clock link are provided on a package substrate directly.

14. The chip-to-chip interface of claim 1, wherein the bidirectional data links and the clock link are provided on an interposer or bridge die.

15. The chip-to-chip interface of claim 1, further comprising:
a common power supply shared by the first and the second chip.

16. The chip-to-chip interface of claim 1, wherein the bidirectional data links comprise a single channel.

17. The chip-to-chip interface of claim 16, wherein the chip-to-chip interface comprises a plurality of channels.

18. The chip-to-chip interface of claim 1, wherein the timing of the clock signal is adjusted during operation in response to a measured temperature, a measured voltage, or a measured delay in a reference circuit, and
wherein the adjustment of the clock signal is based upon a Gray-encoded clock signal delay.

19. The chip-to-chip interface of claim 1, wherein the clock driver circuit is configured to adjust the clock signal delay over a series of steps in response to the clock delay signal, which is encoded such that the clock signal delay is adjusted at each one of the series of steps in accordance with a single bit change of the clock delay signal.

20. The chip-to-chip interface of claim 1, wherein the multiple rising edges for the single transmission comprise delay glitches.

21. A multi-chip module (MCM), comprising:
a first chip;
a second chip; and
a chip-to-chip interface that enables a transfer of data signals between the first chip and the second chip, comprising:
bidirectional data links configured to transmit data signals and a direction indicator bit between the first chip and the second chip,
wherein the direction indicator bit switches a direction of a data signal transmission in real-time;
a clock link configured to transmit a clock signal common to the bidirectional data links between the first chip and the second chip,
wherein the bidirectional data links and the clock link are comprised of conductive traces between the first and second chips and laid out to be of substantially equal length;
a decoder configured to output a clock delay signal based upon a delay control signal; and
a clock driver circuit having a digitally programmable clock signal delay that is based upon the clock delay signal, which prevents the clock signal from including multiple rising edges for a single transmission,
wherein a timing of the clock signal is adjusted in response to the digitally programmable clock signal delay.

22. The MCM of claim 21, wherein the direction indicator bit is encoded in a redundant bit of the data signals.

23. The MCM of claim 21, wherein at least one of the bidirectional data links is dedicated to transmit the direction indicator bit.

24. The MCM of claim 21, wherein the chip-to-chip interface further comprises:
a synchronization link configured to transmit a synchronization pulse to synchronize a deserializer of one of the first or the second chip with a serializer of the other one of the first or the second chip.

25. The MCM of claim 21, further comprising:
conductive bumps, which connect the bidirectional data link and the clock link between the first and the second chip, provided on each of the first and the second chip with a symmetrical mapping layout.

26. The MCM of claim 21, further comprising:
a package substrate on which the bidirectional data link and the clock link are directly provided.

27. The MCM of claim 21, further comprising:
an interposer or bridge die on which the bidirectional data link and the clock link are provided.

28. The MCM of claim 21, further comprising:
a common power supply shared by the first and the second chip.

* * * * *